(12) United States Patent
Nate et al.

(10) Patent No.: US 11,509,225 B2
(45) Date of Patent: Nov. 22, 2022

(54) POWER IC INCLUDING A FEEDBACK RESISTOR, AND A SWITCHING POWER SUPPLY AND ELECTRONIC APPLIANCE INCLUDING THE POWER IC

(71) Applicant: Rohm Co., Ltd., Kyoto (JP)

(72) Inventors: Satoru Nate, Kyoto (JP); Yoshinori Sato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 246 days.

(21) Appl. No.: 16/650,639

(22) PCT Filed: Aug. 28, 2018

(86) PCT No.: PCT/JP2018/031757
§ 371 (c)(1),
(2) Date: Mar. 25, 2020

(87) PCT Pub. No.: WO2019/065049
PCT Pub. Date: Apr. 4, 2019

(65) Prior Publication Data
US 2020/0251991 A1    Aug. 6, 2020

(30) Foreign Application Priority Data

Sep. 28, 2017 (JP) .............................. JP2017-188171
Sep. 28, 2017 (JP) .............................. JP2017-188181

(51) Int. Cl.
*H02M 3/335*    (2006.01)
*H02M 1/08*    (2006.01)
(Continued)

(52) U.S. Cl.
CPC ............. *H02M 3/335* (2013.01); *H02M 1/08* (2013.01); *H02M 1/4208* (2013.01);
(Continued)

(58) Field of Classification Search
CPC ...... H02M 3/335; H02M 3/003; H02M 3/156; H02M 3/33523; H02M 1/08;
(Continued)

(56) References Cited

U.S. PATENT DOCUMENTS

2001/0035554 A1* 11/2001 Yamauchi ........... H01L 27/0629
257/E27.047
2008/0117653 A1    5/2008 Saito
(Continued)

FOREIGN PATENT DOCUMENTS

CN          103296876 A  *  9/2013
JP          2008-153636 A    7/2008
(Continued)

OTHER PUBLICATIONS

Japan Patent Office, International Search Report for PCT/JP2018/031757 dated Oct. 23, 2018 with English translation.

*Primary Examiner* — Kyle J Moody
*Assistant Examiner* — Jye-June Lee
(74) *Attorney, Agent, or Firm* — Fish & Richardson P.C.

(57) ABSTRACT

This power supply IC is a semiconductor integrated circuit device serving as a main part for controlling a switching power supply and is formed by integrating a feedback resistor and an output feedback control unit on a single semiconductor substrate, said feedback resistor generating a feedback voltage by dividing the output voltage of the switching power supply (or the induced voltage appearing across an auxiliary winding provided on the primary side of a transformer included in an insulation-type switching power supply), said output feedback control unit performing output feedback control of the switching power supply in accordance with the feedback voltage. The feedback resistor is a polysilicon resistor having a withstand voltage of 100 V or more. A high-voltage region having higher withstand voltage in the substrate thickness direction than the other
(Continued)

region is formed in the semiconductor substrate, and the feedback resistor is formed on the high-voltage region.

9 Claims, 11 Drawing Sheets

(51) Int. Cl.
    *H02M 1/42*     (2007.01)
    *H01L 27/06*     (2006.01)
    *H01L 49/02*     (2006.01)
    *H01L 29/40*     (2006.01)
    *H01L 29/78*     (2006.01)

(52) U.S. Cl.
    CPC .......... *H01L 27/0629* (2013.01); *H01L 28/20* (2013.01); *H01L 29/402* (2013.01); *H01L 29/408* (2013.01); *H01L 29/7816* (2013.01)

(58) Field of Classification Search
    CPC .. H02M 1/4208; H01L 27/0629; H01L 28/20; H01L 29/402; H01L 29/408; H01L 29/7816; H01L 29/0696; H01L 29/1045; H01L 29/42368; H01L 29/404; H01L 29/7835; H01L 29/78; H01L 23/50
    See application file for complete search history.

(56) References Cited

U.S. PATENT DOCUMENTS

| 2009/0302384 | A1* | 12/2009 | Izumi | ................. H01L 27/0629 |
| | | | | 257/E29.256 |
| 2010/0259952 | A1* | 10/2010 | Zhu | ......................... H02M 1/36 |
| | | | | 363/20 |
| 2015/0098255 | A1* | 4/2015 | Nate | ................. H02M 3/33523 |
| | | | | 363/21.16 |

FOREIGN PATENT DOCUMENTS

| JP | 2009-295783 A | 12/2009 |
| JP | 2012-034557 A | 2/2012 |
| JP | 2012-069759 A | 4/2012 |
| JP | 2014-027751 A | 2/2014 |
| JP | 2014-112996 A | 6/2014 |
| JP | 2015-091206 A | 5/2015 |

* cited by examiner

POWER IC INCLUDING A FEEDBACK RESISTOR, AND A SWITCHING POWER SUPPLY AND ELECTRONIC APPLIANCE INCLUDING THE POWER IC

TECHNICAL FIELD

The present invention relates to power ICs.

BACKGROUND ART

Generally, power ICs, which are used as a principal controller in switching power supplies, perform output feedback control by receiving a feedback voltage commensurate with an output voltage (i.e., a division voltage of the output voltage).

Some power ICs that are used as a principal controller in isolated switching power supplies perform output feedback control by receiving a feedback voltage commensurate with an induced voltage in an auxiliary winding provided on the primary side of a transformer (i.e., a division voltage of the induced voltage).

Examples of the prior technology mentioned above are seen in Patent Documents 1 and 2 identified below.

CITATION LIST

Patent Literature

Patent Document 1: Japanese Unexamined Patent Application Publication No. 2014-027751.

Patent Document 2: Japanese Unexamined Patent Application Publication No. 2014-112996.

SUMMARY OF INVENTION

Technical Problem

Conventional power ICs need a feedback resistor to be externally connected to them for the purpose of generating a feedback voltage by dividing an output voltage or an induced voltage. Inconveniently, externally connecting a feedback resistor leads to a number of problems to be solved, such as an increased number of components, reduced noise tolerance, difficulty controlling the output voltage variably, necessity for dual overvoltage protection, and necessity for open/short protection for a feedback resistor terminal.

In view of the above-mentioned problems encountered by the present inventors, an object of the invention disclosed herein is to provide a power IC that gives solutions to various problems resulting from a feedback resistor being externally connected.

Solution to Problem

According to one aspect of what is disclosed herein, a power IC for use as a principal controller in a switching power supply includes: a feedback resistor configured to generate a feedback voltage by dividing the output voltage of the switching power supply or a voltage commensurate with the output voltage of the switching power supply; and an output feedback controller configured to perform output feedback control on the switching power supply in accordance with the feedback voltage. The feedback resistor and the output feedback controller are integrated on a single semiconductor substrate. The feedback resistor is a polysilicon resistor with a withstand voltage of 100 V or higher.

These and other features, elements, steps, benefits, and characteristics of the present invention will become clearer through the following detailed description of illustrative embodiments of the invention taken in conjunction with the accompanying drawings.

Advantageous Effects of Invention

According to the invention disclosed herein, it is possible to provide a power IC that gives solutions to various problems resulting from a feedback resistor being externally connected.

DESCRIPTION OF EMBODIMENTS

Switching Power Supply (First Embodiment)

Figure 1:
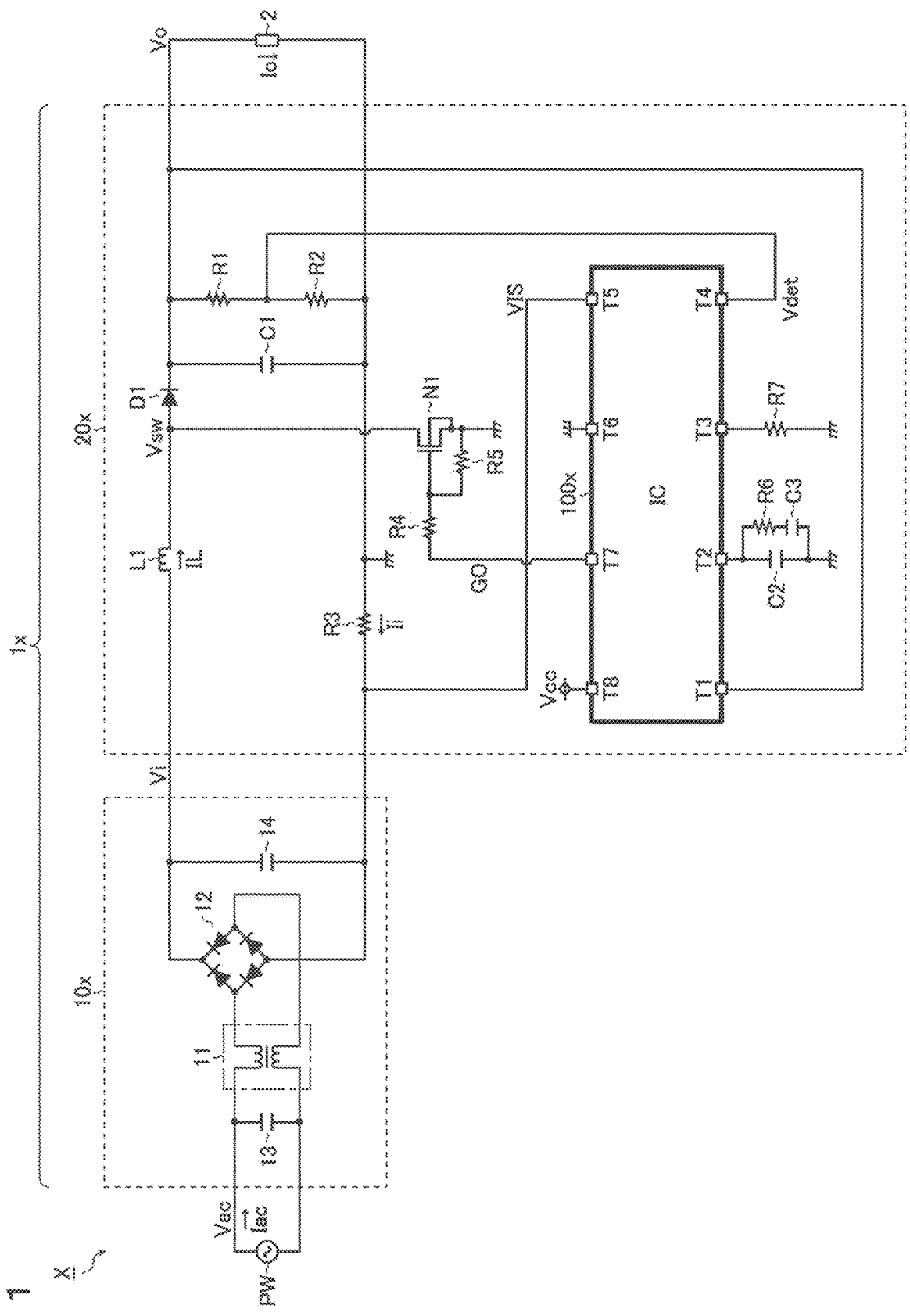
FIG. 1 is a block diagram showing an overall configuration (a first embodiment) of an electronic appliance incorporating a switching power supply.

FIG. 1 is a block diagram showing an overall configuration of an electronic appliance incorporating a non-isolated switching power supply. The electronic appliance X of this configuration example includes a switching power supply 1*x* and a load 2, the latter operating by being supplied with electric power from the former.

The switching power supply 1*x* is a means for converting an alternating-current input voltage Vac (e.g., AC 85 to 265 V) supplied from a commercial power source PW into a desired direct-current output voltage Vo (e.g., DC 400 V) to supply this to the load 2. The switching power supply 1*x* includes a rectifier 10*x* and a DC-DC converter 20*x*.

The rectifier 10*x* is a circuit block that generates from the alternating-current input voltage Vac a direct-current input voltage Vi (e.g., DC 120 to 375 V) to supply this to the DC-DC converter 20*x*. The rectifier 10*x* includes a filter 11, a diode bridge 12, and capacitors 13 and 14. The filter 11 eliminates noise and surges from the alternating-current input voltage Vac. The diode bridge 12 performs full-wave rectification on the alternating-current input voltage Vac to generate the direct-current input voltage Vi. The capacitor 13 eliminates harmonic noise from the alternating-current input voltage Vac. The capacitor 14 smooths the direct-current input voltage Vi. A protective element such as a fuse can be provided in a stage preceding the rectifier 10x.

The DC-DC converter 20x is a circuit block that generates from the direct-current input voltage Vi the desired direct-current output voltage Vo to supply this to the load 2. The DC-DC converter 20x includes a power IC 100x and various discrete components externally connected to it (an N-channel MOS field-effect transistor N1, a coil L1, a diode D1, resistors R1 to R7, and capacitors C1 to C3).

The power IC 100x is a semiconductor integrated circuit device that acts as a principal controller in the switching power supply 1x (in particular, the DC-DC converter 20x), and is provided with, as means for establishing electrical connection with outside the device, external terminals T1 to T8. Needless to say, the power IC 100x can be provided with any external terminal other than those just mentioned.

The external terminal T1 (output feedback terminal) is connected to an output terminal for the direct-current output voltage Vo. A distinctive feature of the power IC 100x is that it has a feedback resistor for dividing the direct-current output voltage Vo incorporated in it, and this feature will be described in detail later.

The external terminal T2 (phase compensation terminal) is connected to the respective first terminals of the capacitor C2 and the resistors R6. The second terminal of the resistors R6 is connected to the first terminal of the capacitor C3. The respective second terminals of the capacitors C2 and C3 are both connected to a grounded terminal. So connected, the capacitors C2 and C3 and the resistors R6 function as a phase compensating means for an output feedback controller (described in detail later) integrated in the power IC 100x.

The external terminal T3 (clock control terminal) is connected to the first terminal of the resistors R7. The second terminal of the resistors R7 is connected to the grounded terminal. The resistors R7 functions as a frequency adjusting means for an oscillator (described in detail later) integrated in the power IC 100x.

The external terminal T4 (overvoltage detection terminal) is connected to the connection node between the resistors R1 and R2, which are connected in series between the output terminal for the direct-current output voltage Vo and the grounded terminal. The resistors R1 and R2 function as a voltage dividing means for yielding, from the connection node between them, a division voltage Vdet ($=Vo \times R2/(R1+R2)$) commensurate with the direct-current output voltage Vo.

The external terminal T5 (current detection terminal) is connected to the connection node between the first terminal of the resistors R3 and the negative-side output terminal of the diode bridge 12. The second terminal of the resistors R3 is connected to the grounded terminal. Thus, at the external terminal T5 appears a sense voltage VIS ($=Ii \times R3$) commensurate with the direct-current input current Ii (<0) passing through the negative-side output terminal of the diode bridge 12.

The external terminal T6 (ground terminal) is connected to the grounded terminal.

The external terminal T7 (output terminal) is connected via the resistors R4 to the gate of the transistor N1. Between the gate and the source of the transistor N1, the resistors R5 is connected. The source and the backgate of the transistor N1 are both connected to the grounded terminal. The first terminal of the coil L1 is connected to the positive-side output terminal of the diode bridge 12 (corresponding to an output terminal for the direct-current input voltage Vi). The second terminal of the coil L1 is connected to the drain of the transistor N1 and to the anode of the diode D1. The cathode of the diode D1 and the first terminal of the capacitor C1 are both connected to the output terminal for the direct-current output voltage Vo. The second terminal of the capacitor C1 is connected to the grounded terminal.

So connected, the transistor N1, the coil L1, the diode D1, and the capacitor C1 function as a boosting (step-up) switching output stage that generates from the direct-current input voltage Vi the direct-current output voltage Vo. The transistor N1 is turned on and off in accordance with a gate signal GO fed in via the external terminal T7. More specifically, the transistor N1 is on when the gate signal GO is at high level, and is off when the gate signal GO is at low level.

Put briefly, the voltage boosting operation of this switching output stage proceeds as follows. When the transistor N1 is turned on, a coil current IL passes through the coil L1 via the transistor N1 to the grounded terminal, so that its electrical energy is stored in the coil L1. Meanwhile, a switching voltage Vsw that appears at the anode of the diode D1 falls nearly to the ground potential. Accordingly, the diode D1 is reverse-biased, and thus no current passes from the capacitor C1 toward the transistor N1.

On the other hand, when the transistor N1 is turned off, a back electromotive force that appears in the coil L1 causes the electrical energy stored in it to be discharged as a current. Meanwhile, the diode D1 is forward-biased; thus the coil current IL that passes through the diode D1 passes, as a direct-current output current Io, from the output terminal for the direct-current output voltage Vo into the load 2, and also passes via the capacitor C1 into the grounded terminal, so that the capacitor C1 is charged. Similar operation repeats, so that the load 2 is supplied with the direct-current output voltage Vo resulting from the direct-current input voltage Vi being boosted.

The external terminal T8 (power terminal) is connected to an application terminal for a supply voltage Vcc.

Power IC (First Embodiment)

Figure 2:
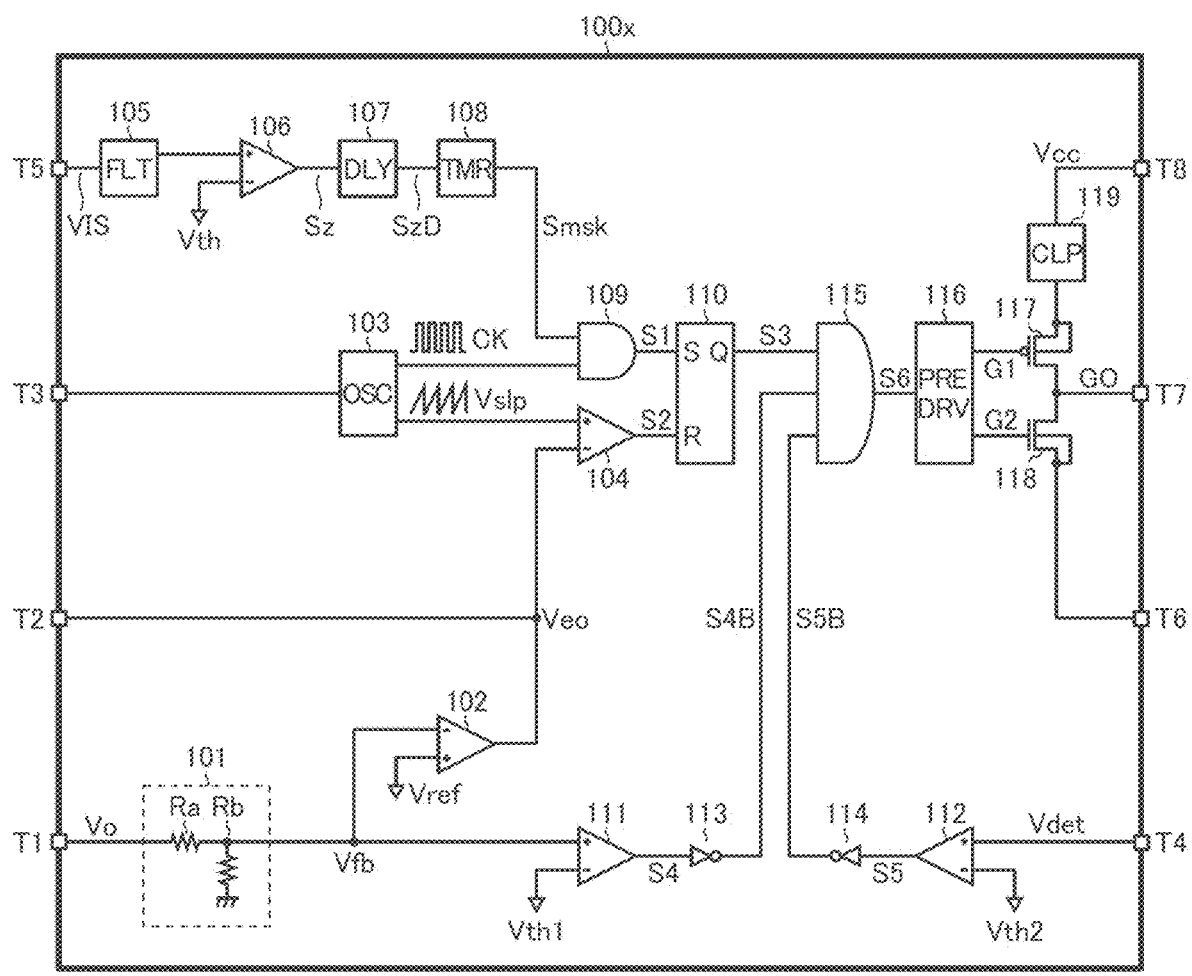
FIG. 2 is a block diagram showing one configuration example of a power IC according to the first embodiment.

FIG. 2 is a block diagram showing one configuration example of the power IC 100x. The power IC 100x of this configuration example is built by integrating together a resistor voltage divider 101, an error amplifier 102, an oscillator 103, a comparator 104, a filter 105, a comparator 106, a signal retarder 107, a timer 108, an AND operator 109, an RS flip-flop 110, comparators 111 and 112, inverters 113 and 114, an AND operator 115, a pre-driver 116, a P-channel MOS field-effect transistor 117, an N-channel MOS field-effect transistor 118, and a clamper 119.

The resistor voltage divider 101 includes feedback resistors Ra and Rb that are connected in series between the external terminal T1 (i.e., an application terminal for the direct-current output voltage Vo) and the grounded terminal, and yields, from the connection node between those resistors, a feedback voltage Vfb ($=Vo \times Rb/(Ra+Rb)$) commensurate with the direct-current output voltage Vo. To reduce the stand-by power consumption of the power IC 100x, it is preferable that the feedback resistors Ra and Rb be given resistance values of the order of megohms.

Incorporating the feedback resistors Ra and Rb as described above helps reduce the number of components and helps improve noise tolerance. Using variable resistors for the feedback resistors Ra and Rb facilitates variable control of the target value of the direct-current output voltage Vo. With no feedback resistors externally connected to it, the external terminal T1 does not require open/short protection.

The structure for integration of the feedback resistors Ra and Rb will be described in detail later.

The error amplifier 102 generates an error signal Veo commensurate with the difference between the feedback voltage Vfb, which is fed to the inverting input terminal (−) of the error amplifier 102, and a reference voltage Vref (e.g., 2.5 V), which is fed to the non-inverting input terminal (+) of the error amplifier 102. More specifically, the error amplifier 102 lowers the error signal Veo when the feedback voltage Vfb is higher than the reference voltage Vref, and raises the error signal Veo when the feedback voltage Vfb is lower than the reference voltage Vref. The output terminal of the error amplifier 102 (i.e., an output terminal for the error signal Veo) is connected to the external terminal T2.

The oscillator 103 generates pulses in a clock signal CK and in a slope signal Vslp at a predetermined oscillation frequency fosc. The oscillation frequency fosc can be adjusted as desired in accordance with the resistance value of the resistors R7 (see FIG. 1), which is externally connected to the external terminal T3.

The comparator 104 generates an off signal S2 by comparing the error signal Veo, which is fed to the inverting input terminal (−) of the comparator 104, with the slope signal Vslp, which is fed to the non-inverting input terminal (+) of the comparator 104. The off signal S2 is at low level when the error signal Veo is higher than the slope signal Vslp, and is at high level when the error signal Veo is lower than the slope signal Vslp.

The filter 105 eliminates noise from the sense voltage VIS, which is fed in via the external terminal T2.

The comparator 106 generates a zero-cross detection signal Sz by comparing the filtered sense voltage VIS, which is fed to the non-inverting input terminal (+) of the comparator 106, with a threshold voltage Vth (≈0 V), which is fed to the inverting input terminal (−) of the comparator 106. The zero-cross detection signal Sz is at low level (a logic level corresponding to no zero cross being detected) when the sense voltage VIS is lower than the threshold voltage Vth, and is at high level (a logic level corresponding to a zero cross being detected) when the sense voltage VIS is higher than the threshold voltage Vth.

The signal retarder 107 gives the zero-cross detection signal Sz a predetermined delay to generate a delayed zero-cross detection signal SzD.

The timer 108 generates a mask signal Smsk in accordance with the delayed zero-cross detection signal SzD. The mask signal Smsk turns to low level when starting to mask (invalidate) the clock signal CK, and turns to high level when stopping masking the clock signal CK.

The AND operator 109 performs an AND operation between the clock signal CK and the mask signal Smsk to generate an on signal S1. The on signal S1 is at high level when the clock signal CK and the mask signal Smsk are both at high level, and is at low level when at least one of the clock signal CK and the mask signal Smsk is at low level.

Thus, during the high-level period of the mask signal Smsk (i.e., the non-masking period), the clock signal CK is simply passed through to be output as the on signal S1; on the other hand, during the low-level period of the mask signal Smsk (i.e., the masking period), the on signal S1 is held at low level. Accordingly, the pulse frequency of the on signal S1 (and hence the switching frequency of the DC-DC converter 20x) is variably controlled in accordance with the mask signal Smsk.

The filter 105, the comparator 106, the signal retarder 107, the timer 108, and the AND operator 109 described above function as a power factor correction functional block (a PFC functional block) that keeps equal the phase of the direct-current input voltage Vi and the phase of the direct-current input current Ii (and hence the phase of the alternating-current input voltage Vac and the phase of the alternating-current input current Iac).

The RS flip-flop 110 generates a pulse width modulation signal S3 in accordance with the on signal S1, which is fed to the set terminal (S) of the RS flip-flop 110, and the off signal S2, which is fed to the reset terminal (R) of the RS flip-flop 110. More specifically, the RS flip-flop 110 sets the pulse width modulation signal S3 to high level (a logic level corresponding to the transistor N1 being on) at a rising edge in the on signal S1, and resets the pulse width modulation signal S3 to low level (a logic level corresponding to the transistor N1 being off) at a rising edge in the off signal S2.

The comparator 111 generates an overvoltage protection signal S4 by comparing the feedback voltage Vfb, which is fed to the non-inverting input terminal (+) of the comparator 111, with a threshold voltage Vth1, which is fed to the inverting input terminal (−) of the comparator 111. The overvoltage protection signal S4 is at high level (a logic level corresponding to an overvoltage being detected) when the feedback voltage Vfb is higher than the threshold voltage Vth1, and is at low level (a logic level corresponding to no overvoltage being detected) when the feedback voltage Vfb is lower than the threshold voltage Vth1.

It is preferable that the threshold voltage Vth1 be given hysteresis. For example, the threshold voltage Vth1 can be switched between, when the overvoltage protection signal S4 is at low level, an upper threshold voltage Vth1H (e.g., 2.7 V) and, when the overvoltage protection signal S4 is at high level, a lower threshold voltage Vth1L (e.g., 2.6 V).

The comparator 112 generates an overvoltage protection signal S5 by comparing the division voltage Vdet, which is fed to the non-inverting input terminal (+) of the comparator 112, with a threshold voltage Vth2, which is fed to the inverting input terminal (−) of the comparator 112. The overvoltage protection signal S5 is at high level (a logic level corresponding to an overvoltage being detected) when the division voltage Vdet is higher than the threshold voltage Vth2, and is at low level (a logic level corresponding to no overvoltage being detected) when the division voltage Vdet is lower than the threshold voltage Vth2.

It is preferable that the threshold voltage Vth2 be given hysteresis. For example, the threshold voltage Vth2 can be switched between, when the overvoltage protection signal S5 is at low level, an upper threshold voltage Vth2H (e.g., 2.7 V) and, when the overvoltage protection signal S5 is at high level, a lower threshold voltage Vth2L (e.g., 2.6 V).

The inverter 113 logically inverts the overvoltage protection signal S4 to generate an inverted overvoltage protection signal S4B. Accordingly, the inverted overvoltage protection signal S4B is at low level (a logic level corresponding to an overvoltage being detected) when the overvoltage protection signal S4 is at high level, and is at high level (a logic level corresponding to no overvoltage being detected) when the overvoltage protection signal S4 is at low level.

The inverter 114 logically inverts the overvoltage protection signal S5 to generate an inverted overvoltage protection signal S5B. Accordingly, the inverted overvoltage protection signal S5B is at low level (a logic level corresponding to an overvoltage being detected) when the overvoltage protection signal S5 is at high level, and is at high level (a logic level corresponding to no overvoltage being detected) when the overvoltage protection signal S5 is at low level.

The AND operator 115 performs an AND operation among the pulse width modulation signal S3 and the inverted overvoltage protection signals S4B and S5B to generate a switching control signal S6. The switching control signal S6 is at high level when the pulse width modulation signal S3 and the inverted overvoltage protection signals S4B and S5B are all at high level, and is at low level when at least one of the pulse width modulation signal S3 and the inverted overvoltage protection signals S4B and S5B is at low level. That is, when the inverted overvoltage protection signals S4B and S5B are both at high level (a logic level corresponding to no overvoltage being detected), the pulse width modulation signal S3 is simply passed through to be output as the switching control signal S6; on the other hand, when at least one of the inverted overvoltage protection signals S4B and S5B is at low level (a logic level corresponding to an overvoltage being detected), the switching control signal S6 is held at low level.

Dual overvoltage protection achieved by monitoring both of the feedback voltage Vfb and the division voltage Vdet as described above helps enhance the safety of the power IC 100x.

Even then, owing to the resistor voltage divider 101 being integrated, the power IC 100x of this configuration example can directly receive the direct-current output voltage Vo; it is thus free from concern for an associated open/short fault as could occur in the conventional configuration where the feedback resistors Ra and Rb are externally connected.

In view of what has just been mentioned, overvoltage protection based on the feedback voltage Vfb is considered to be sufficiently reliable. Thus, where priority is given to a reduced number of components and a reduced chip area, dual overvoltage protection (the resistors R1 and R2, the comparator 112, and the inverter 114) can be omitted.

The external terminal T4, which is then unnecessary, can be disposed as an unused terminal (NC (non-connected) pin) beside the external terminal T1. This structure permits a sufficient creepage distance to be secured between the external terminal T1, to which a high voltage is applied, and another external terminal, and offers satisfactory insulation between the two terminals.

The pre-driver 116 generates gate signals G1 and G2 in accordance with the switching control signal S6. More specifically, configured to turn on and off the transistors 117 and 118 complementarily, the pre-driver 116 keeps the gate signals G1 and G2 both at low level when the switching control signal S6 is at high level, and keeps the gate signals G1 and G2 both at high level when the switching control signal S6 is at low level.

With a view to preventing an excessive through current through the transistors 117 and 118, however, a simultaneously-on period (what is called "dead time"), that is, a period in which the gate signal G1 is at high level and the gate signal G2 is at low level, is provided at the transition of those transistors between the on and off states.

The transistors 117 and 118 function as a half-bridge output stage for generating the gate signal GO. The source and the backgate of the transistor 117 are both connected via the clamper 119 to the external terminal T8 (i.e., the power terminal). The respective drains of the transistors 117 and 118 are connected to the external terminal T7 (i.e., the output terminal) as an output terminal for the gate signal GO. The source and the backgate of the transistor 118 are both connected to the external terminal T6 (i.e., the ground terminal).

The gate of the transistor 117 is fed with the gate signal G1. The transistor 117 is off when the gate signal G1 is at high level, and is on when the gate signal G1 is at low level.

The gate of the transistor 118 is fed with the gate signal G2. The transistor 118 is on when the gate signal G2 is at high level, and is off when the gate signal G2 is at low level.

The clamper 119 limits the supply voltage Vcc, which is applied to the source of the transistor 117, such that the supply voltage Vcc remains equal to or lower than a predetermined value.

Of the circuit elements described above, the error amplifier 102, the oscillator 103, the comparator 104, the RS flip-flop 110, the pre-driver 116, and the transistors 117 and 118 function as an output feedback controller that performs output feedback control on the switching power supply 1x (the DC-DC converter 20x) in accordance with the feedback voltage Vfb.

Though not expressly illustrated, the power IC 100x can further have any elements other than the above-mentioned circuit elements integrated in it, such as a soft-start circuit, such elements including a reference voltage source, various protection circuits (such as a temperature protection circuit, an overcurrent protection circuit, and an undervoltage protection circuit).

Isolated Switching Power Supply (Second Embodiment)

Figure 3:
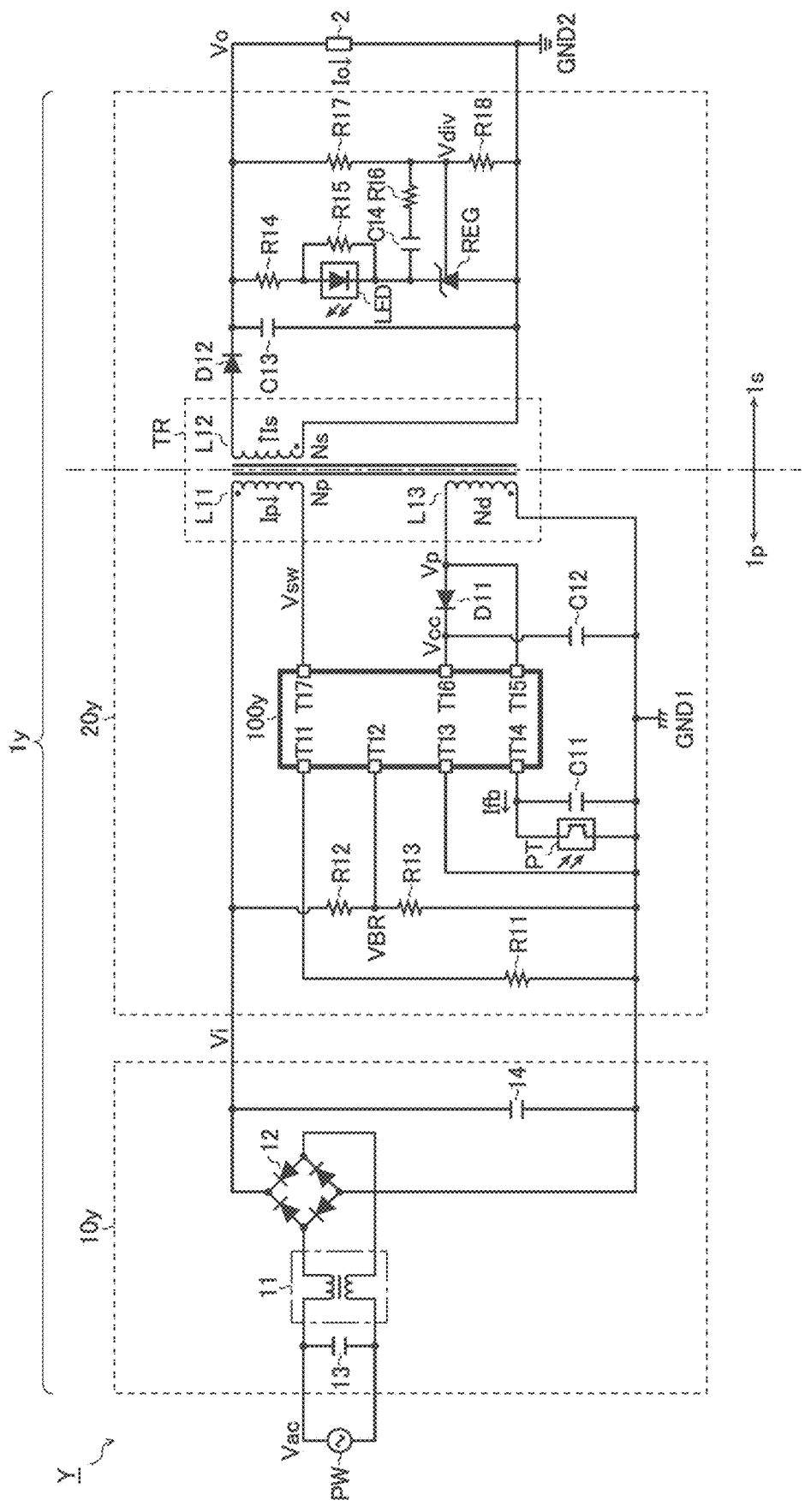
FIG. 3 is a block diagram showing an overall configuration (a second embodiment) of an electronic appliance incorporating an isolated switching power supply.

FIG. 3 is a block diagram showing an overall configuration (a second embodiment) of an electronic appliance incorporating an isolated switching power supply. The electronic appliance Y of this configuration example includes an isolated switching power supply 1y and a load 2, the latter operating by being supplied with electric power from the former.

The isolated switching power supply 1y is a means for, while electrically isolating a primary circuit system 1p (GND1 system) and a secondary circuit system is (GND2 system) from each other, converting an alternating-current input voltage Vac (e.g., AC 85 to 265 V), which is supplied from a commercial power source PW to the primary circuit system 1p, into a desired direct-current output voltage Vo (e.g., DC 10 to 30 V) and supplying this to the load 2 in the secondary circuit system 1s. The isolated switching power supply 1y includes a rectifier 10y and a DC-DC converter 20y.

The rectifier 10y is a circuit block that generates from the alternating-current input voltage Vac a direct-current input voltage Vi (e.g., DC 120 to 375 V) to supply this to the DC-DC converter 20y. The rectifier 10y includes a filter 11, a diode bridge 12, and capacitors 13 and 14. The filter 11 eliminates noise and surges from the alternating-current input voltage Vac. The diode bridge 12 performs full-wave rectification on the alternating-current input voltage Vac to generate the direct-current input voltage Vi. The capacitor 13 eliminates harmonic noise from the alternating-current input voltage Vac. The capacitor 14 smooths the direct-current input voltage Vi. A protective element such as a fuse can be provided in a stage preceding the rectifier 10y.

The DC-DC converter 20y is a circuit block that generates from the direct-current input voltage Vi the desired direct-current output voltage Vo to supply this to the load 2. The DC-DC converter 20y includes a power IC 100y and various discrete components externally connected to it (a transformer TR, resistors R11 to R18, capacitors C11 to C14, diodes D11 and D12, a light-emitting diode LED, a phototransistor PT, and a shunt regulator REG).

The transformer TR includes a primary winding L11 (with a number of turns Np) and a secondary winding L12 (with a number of turns Ns) that are magnetically coupled together with opposite polarities while electrically isolating the primary and secondary circuit systems $1p$ and $1s$ from each other. The transformer TR also includes, as a means for generating a supply voltage Vcc for the power IC $100y$ as well as the feedback voltage Vfb, an auxiliary winding L13 (with a number of turns Nd) provided in the primary circuit system $1p$.

The first terminal of the primary winding L11 is connected to an application terminal for the direct-current input voltage Vi. The second terminal of the primary winding L11 is connected to an external terminal T17 (described in detail later) of the power IC $100y$. The first terminal of the secondary winding L12 is connected to the anode of the diode D12. The second terminal of the secondary winding L12 is connected to a grounded terminal GND2 in the secondary circuit system $1s$.

The numbers of turns Np and Ns can be adjusted as desired so that the desired direct-current output voltage Vo is obtained. For example, the larger the number of turns Np, or the smaller the number of turns Ns, the lower the direct-current output voltage Vo; the smaller the number of turns Np or the larger the number of turns Ns, the higher the direct-current output voltage Vo.

The power IC $100y$ is a semiconductor integrated circuit device provided in the primary circuit system $1p$, and acts as a principal controller in the isolated switching power supply $1y$ (in particular, the DC-DC converter $20y$). The power IC $100y$ is provided with, as means for establishing electrical connection with outside the device, external terminals T11 to T17. Needless to say, the power IC $100y$ can be provided with any external terminal other than those just mentioned.

The external terminal T11 (source terminal) is connected to the first terminal of the resistor R11. The second terminal of the resistor R11 is connected to a grounded terminal GND1 in the primary circuit system $1p$. The resistor R11 functions as a sense resistor for sensing, as a voltage signal, a primary current Ip that passes through an output switch integrated in the power IC $100y$.

The external terminal T12 (brown-out terminal) is connected to the connection node between the resistors R12 and R13, which are connected in series between the application terminal for the direct-current input voltage Vi and the grounded terminal GND1. The resistors R12 and R13 function as a voltage divider that yields, from the connection node between those resistors, a detection voltage VBR ($=Vi \times R13/(R12+R13)$) commensurate with the direct-current input voltage Vi.

The external terminal T13 (ground terminal) is connected to the grounded terminal GND1.

The external terminal T14 (feedback current input terminal) is connected to the collector of the phototransistor PT and to the first terminal of the capacitor C11. The emitter of the phototransistor PT and the second terminal of the capacitor C11 are both connected to the grounded terminal GND1. The phototransistor PT, together with the light-emitting diode LED provided in the secondary circuit system $1s$, functions as a photocoupler, and generates a feedback current Ifb in accordance with an optical signal from the light-emitting diode LED.

The external terminal T15 (induced voltage input terminal) is connected to the first terminal of the auxiliary winding L13 (corresponding to an application terminal for an induced voltage Vp). A distinctive feature of the power IC $100y$ is that it has a feedback resistor for dividing the induced voltage Vp integrated in it, and this feature will be described in detail later.

The external terminal T16 (power terminal) is connected to the connection node between the cathode of the diode D11 and the first terminal of the capacitor C12 (corresponding to an application terminal for a supply voltage Vcc). The anode of the diode D11 is connected to the first terminal of the auxiliary winding L13. The respective second terminals of the capacitor C12 and the auxiliary winding L13 are both connected to the grounded terminal GND1.

So connected, the diode D11 and the capacitor C12 function as a supply voltage generator that generates a supply voltage Vcc for the power IC $100y$ by rectifying and smoothing an induced voltage Vp that appear in the auxiliary winding L13. The turns ratio of the primary winding L11 to auxiliary winding L13 can be set appropriately with consideration given to the supply voltage Vcc needed by the power IC $100y$.

The external terminal T17 (drain terminal) is, as mentioned previously, connected to the second terminal of the primary winding L11 (corresponding to an application terminal for a switching voltage Vsw). Between the external terminals T16 and T17, a terminal-to-terminal distance twice the regular value is secured by omitting the external terminal that would otherwise be disposed between them.

Next, the interconnection among the circuit elements provided in the secondary circuit system is will be described.

As mentioned previously, the anode of the diode D12 is connected to the first terminal of the secondary winding L12. The cathode of the diode D12 and the first terminal of the capacitor C13 are both connected to an output terminal for the direct-current output voltage Vo. The second terminal of the capacitor C13 is connected to the grounded terminal GND2. So connected, the diode D12 and the capacitor C13 function as a rectifier-smoother that generates the direct-current output voltage Vo by rectifying and smoothing an induced voltage that appear in the secondary winding L12.

The first terminal of the resistor R14 is connected to the output terminal for the direct-current output voltage Vo. The second terminal of the resistor R14 is connected to the anode of the light-emitting diode LED and to the first terminal of the resistor R15. The cathode of the light-emitting diode LED and the second terminal of the resistor R15 are both connected to the cathode of the shunt regulator REG. The anode of the shunt regulator REG is connected to the grounded terminal GND2. The gate (corresponding to a control terminal) of the shunt regulator REG is connected to the connection node between the resistors R17 and R18, which are connected in series between the output terminal for the direct-current output voltage Vo and the grounded terminal GND2 (the connection node corresponding to an application terminal for a division voltage Vdiv ($=Vo \times R18/(R17+R18)$)). The resistor R16 and the capacitor C14 are connected in series between the gate and the cathode of the shunt regulator REG.

The shunt regulator REG controls the current passing through the light-emitting diode LED in accordance with the division voltage Vdiv, which is fed to the gate of the shunt regulator REG. Thus, the group of circuit elements mentioned above (R14 to R18, C14, LED, and REG) functions as an output feedback circuit that generates an optical signal in accordance with the direct-current output voltage Vo to deliver the optical signal to the phototransistor PT in the primary circuit system $1p$.

In the DC-DC converter $20y$ configured as described above, the transformer TR, the diode D12, and the capacitor C13 function as a bucking (step-down) switching output stage of a flyback type that generates from the direct-current input voltage Vi the direct-current output voltage Vo.

Put briefly, the voltage bucking operation of this switching output stage proceeds as follows. When the output switch (described in detail later) integrated between the external terminals T11 and T17 of the power IC 100y is on, a primary current Ip passes from the application terminal for the direct-current input voltage Vi via the primary winding L11, the output switch, and the resistor R11 toward the grounded terminal GND1. Thus, electrical energy is stored in the primary winding L11.

Thereafter, when the output switch is turned off, in the secondary winding L12, which is magnetically coupled with the primary winding L11, an induced voltage appears, with the result that a secondary current Is passes from the secondary winding L12 via the diode D12 toward the grounded terminal GND2. Meanwhile, the load 2 is supplied with the direct-current output voltage Vo resulting from the induced voltage in the secondary winding L12 being rectified and smoothed.

The output switch continues to be turned on and off as described above, so that similar switching operation repeats.

As described above, with the isolated switching power supply 1y of this configuration example, the direct-current output voltage Vo can be generated from the alternating-current input voltage Vac and supplied to the load 2 while the primary and secondary circuit systems 1p and is are electrically isolated from each other.

Power IC (Second Embodiment)

Figure 4:
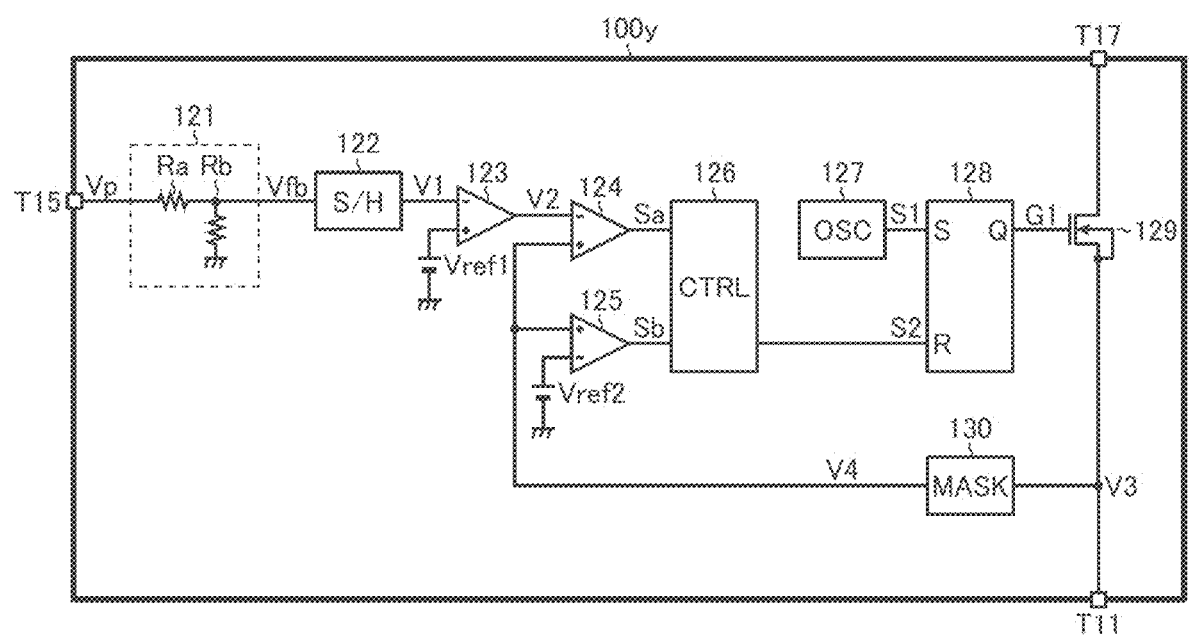
FIG. 4 is a block diagram showing one configuration example of a power IC according to the second embodiment.

FIG. 4 is a block diagram showing one configuration example of the power IC 100y according to the second embodiment. The power IC 100y of this configuration example includes a resistor voltage divider 121, a sample-and-hold circuit 122, an error amplifier 123, comparators 124 and 125, a controller 126, an oscillator 127, an RS flip-flop 128, an output switch 129, and a mask processor 130.

The resistor voltage divider 121 includes feedback resistors Ra and Rb that are connected in series between the external terminal T15 (i.e., an application terminal for the induced voltage Vp) and the grounded terminal GND1, and yields, from the connection node between those resistors, a feedback voltage Vfb (=Vp×Rb/(Ra+Rb)) commensurate with the induced voltage Vp. To reduce the stand-by power consumption of the power IC 100y, it is preferable that the feedback resistors Ra and Rb be given resistance values of the order of megohms.

Here, let the voltage value of the induced voltage Vp during the on-period of the output switch 129 be Vpon and let the voltage value of the induced voltage Vp during the off-period of the output switch 129 be Vpoff, then Vpon≈−Vi×(Nd/Np), falling in the range from −50V to −200V, and Vpoff≈Vo×(Nd/Ns), falling in the range from +10V to +30V.

That is, the voltage value Vpon varies with the direct-current input voltage Vi, and the voltage value Vpoff varies with the direct-current output voltage Vo. Thus, by monitoring, during the off-period of the output switch 129, the feedback voltage Vfb generated from the induced voltage Vp appearing in the auxiliary winding L13, it is possible to perform feedback control on the direct-current output voltage Vo and to apply overvoltage protection.

Incorporating the feedback resistors Ra and Rb helps reduce the number of components and helps improve noise tolerance. Using variable resistors for the feedback resistors Ra and Rb facilitates variable control of the target value of the direct-current output voltage Vo. With no feedback resistors externally connected to it, the external terminal T15 does not require open/short protection. The structure for integration of the feedback resistors Ra and Rb will be described in detail later.

The sample-and-hold circuit 122 samples and holds the feedback voltage Vfb to generate a held voltage V1.

The error amplifier 123 generates an error voltage V2 commensurate with the difference between the held voltage V1, which is fed to the inverting input terminal (−) of the error amplifier 123, and a reference voltage Vref1, which is fed to the non-inverting input terminal (+) of the error amplifier 123. More specifically, the error amplifier 123 lowers the error voltage V2 when the held voltage V1 is higher than the reference voltage Vref1, and raises the error voltage V2 when the held voltage V1 is lower than the reference voltage Vref1.

The comparator 124 generates a comparison signal Sa by comparing the error voltage V2, which is fed to the inverting input terminal (−) of the comparator 124, and a detection voltage V4, which is fed to the non-inverting input terminal (+) of the comparator 124. The comparison signal Sa is at high level when the detection voltage V4 is higher than the error voltage V2, and is at low level when the detection voltage V4 is lower than the error voltage V2.

The comparator 125 generates a comparison signal Sb by comparing a reference voltage Vref2, which is fed to the inverting input terminal (−) of the comparator 125, and the detection voltage V4, which is fed to the non-inverting input terminal (+) of the comparator 125. The comparison signal Sb is at high level when the detection voltage V4 is higher than the reference voltage Vref2, and is at low level when the detection voltage V4 is lower than the reference voltage Vref2.

The controller 126 generates pulses in the off signal S2 in accordance with the comparison signals Sa and Sb. More specifically, the controller 126 generates pulses in the off signal S2 by detecting rising edges in the comparison signals Sa and Sb.

The oscillator 127 generates pulses in the on signal S1 at a predetermined oscillation frequency fosc.

The RS flip-flop 128 generates a gate signal G1 (corresponding to an output control signal) in accordance with the on signal S1, which is fed to the set terminal (S) of the RS flip-flop 128, and the off signal S2, which is fed to the reset terminal (R) of the RS flip-flop 128. More specifically, the RS flip-flop 128 sets the gate signal G1 to high level at a rising edge in the on signal S1, and resets the gate signal G1 to low level at a rising edge in the off signal S2.

The output switch 129 is a switching element that turns on and off the primary current Ip passing through the primary winding L11 by switching, between a conducting state and a cut-off state, the current path leading from the application terminal for the direct-current input voltage Vi via the primary winding L11 to the grounded terminal GND1 in accordance with the gate signal G1. In this configuration example, used as the output switch 129 is an N-channel MOS (metal-oxide-semiconductor) field-effect transistor. Interconnection around it is as follows. The drain of the output switch 129 is connected to the external terminal T17. The source and the backgate of the output switch 129 are both connected to the external terminal T11. The gate of the output switch 129 is connected to an application terminal for the gate signal G1. The output switch 129 is on when the gate signal G1 is at high level, and is off when the gate signal G1 is at low level.

As shown in FIG. 3 referred to previously, between the external terminal T11 and the grounded terminal GND1, the resistor R11 is externally connected as a sense resistor. Thus, at the external terminal T11 appears a sense voltage V3 (=Ip×R11) commensurate with the primary current Ip.

The mask processor 130 subjects the sense voltage V3 to predetermined masking to generate the detection voltage V4. More specifically, the mask processor 130 holds the detection voltage V4 at a zero value for a predetermined masking period starting when the output switch 129 is turned on. This configuration helps eliminate the effect of ringing noise in the sense voltage V3 that occurs when the output switch 129 turns on, and thus helps perform more stable switching control operation.

Of the circuit elements described above, the sample-and-hold circuit 122, the error amplifier 123, the comparators 124 and 125, the controller 126, the oscillator 127, and the RS flip-flop 128 function as an output feedback controller that perform output feedback control on the isolated switching power supply 1y (the DC-DC converter 20y) in accordance with the feedback voltage Vfb.

Though not expressly illustrated, the power IC 100y can further have any elements other than the above-mentioned circuit elements integrated in it, such elements including a soft-start circuit, a reference voltage source, and various protection circuits (such as a temperature protection circuit, an overcurrent protection circuit, and an undervoltage protection circuit).

<Feedback Resistors>

Figure 5:
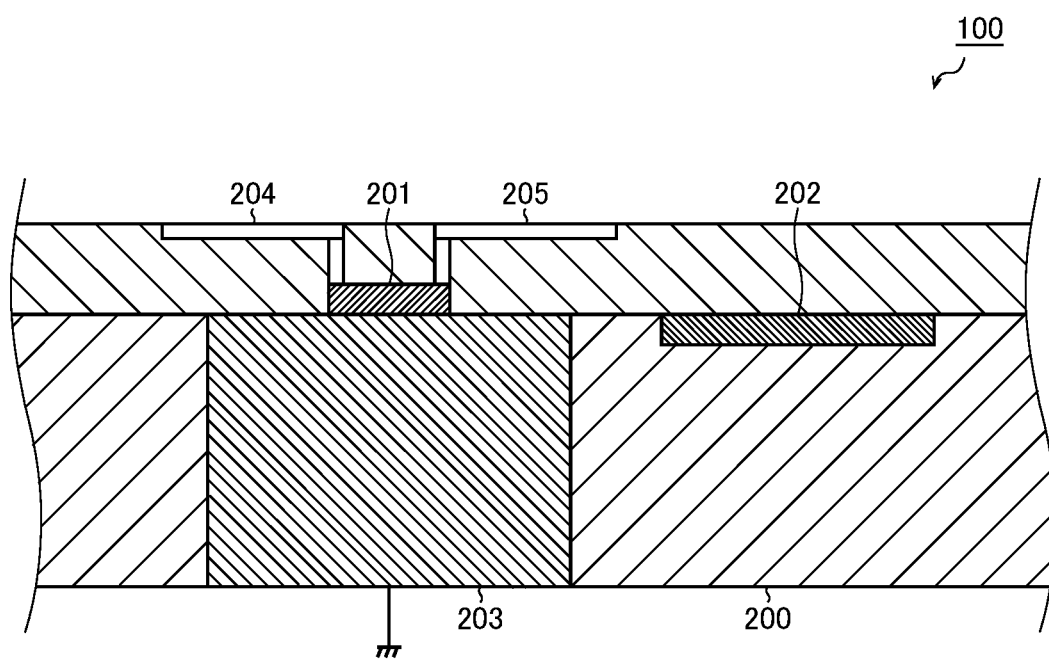
FIG. 5 is a vertical sectional view schematically showing a region where a feedback resistor is formed.

FIG. 5 is a vertical sectional view schematically showing a region where the feedback resistors Ra and Rb are formed in the power IC 100x or 100y (in the following description referred to collectively as "power IC 100"). As shown there, the power IC 100 has a feedback resistor 201 and an output feedback controller 202 integrated on a single semiconductor substrate 200.

The feedback resistor 201 is a means for generating the feedback voltage Vfb by dividing, in the case of the switching power supply 1x, the direct-current output voltage Vo or, in the case of the isolated switching power supply 1y, the induced voltage Vp appearing in the auxiliary winding L13, and the feedback resistors Ra and Rb mentioned previously correspond to the feedback resistor 201. To the first terminal of the feedback resistor 201, a metal conductor 204 leading to the external terminal T1 (output feedback terminal) or to the external terminal T15 (induced voltage input terminal) is connected by way of a via. To the second terminal of the feedback resistor 201, a metal conductor 205 leading to the external terminal T6 or T13 (ground terminal) is connected by way of a via. Though not expressly illustrated, the feedback resistor 201 is also provided with an output terminal for the feedback voltage Vfb (corresponding to the connection node between the feedback resistors Ra and Rb).

The output feedback controller 202 is a means for performing output feedback control on the switching power supply 1x or the isolated switching power supply 1y in accordance with the feedback voltage Vfb. In the first embodiment (FIG. 2), the error amplifier 102, the oscillator 103, the comparator 104, the RS flip-flop 110, the pre-driver 116, the transistors 117 and 118, etc. correspond to the output feedback controller 202. In the second embodiment (FIG. 4), the sample-and-hold circuit 122, the error amplifier 123, the comparators 124 and 125, the controller 126, the oscillator 127, the RS flip-flop 128, etc. correspond to the output feedback controller 202.

Here, it is preferable to use, as the feedback resistor 201, a polysilicon resistor with a withstand voltage of 100 V or higher (in this configuration example, 400 V or higher).

In integrating the feedback resistor 201, it is necessary to have high voltage tolerance not only in the path through the feedback resistor 201 (in the horizontal direction) but also between the feedback resistor 201 and the substrate potential end (in the vertical direction). Accordingly, the semiconductor substrate 200 has formed in it a high-withstand-voltage region 203 in which the withstand voltage in the substrate thickness direction (vertical direction) is higher than elsewhere in the semiconductor substrate 200, and the feedback resistor 201 is formed on the high-withstand-voltage region 203.

With this structure, the feedback resistor 201 can be given a high withstand voltage; it can thus directly receive the direct-current output voltage Vo (e.g., DC 400 V) or the induced voltage Vp (e.g., −200 V to +30V), which swings greatly in both the positive and negative directions.

As the high-withstand-voltage region 203 described above, it is possible to use a LDMOSFET (lateral double-diffused metal-oxide-semiconductor field-effect transistor) region, which has been in practical use in abundant applications requiring increasingly high withstand voltages. The structure of the LDMOSFET region will now be described specifically.

<High-Withstand-Voltage Region (LDMOSFET Region)>

Figure 6:
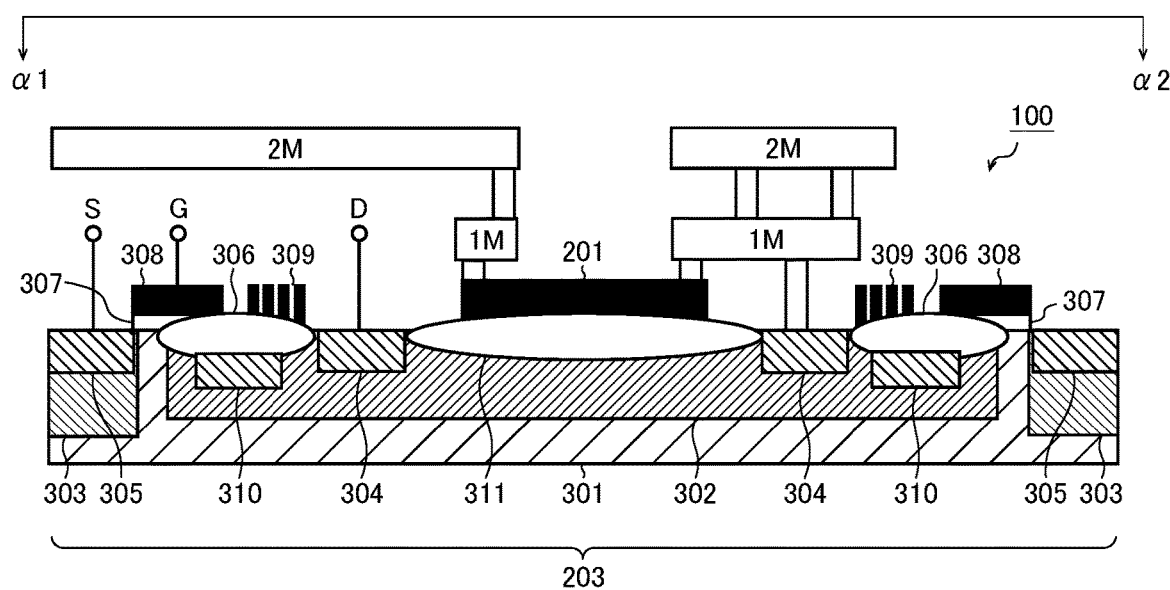
FIG. 6 is a vertical sectional view showing one structure example of a high-withstand-voltage region.
Figure 7:
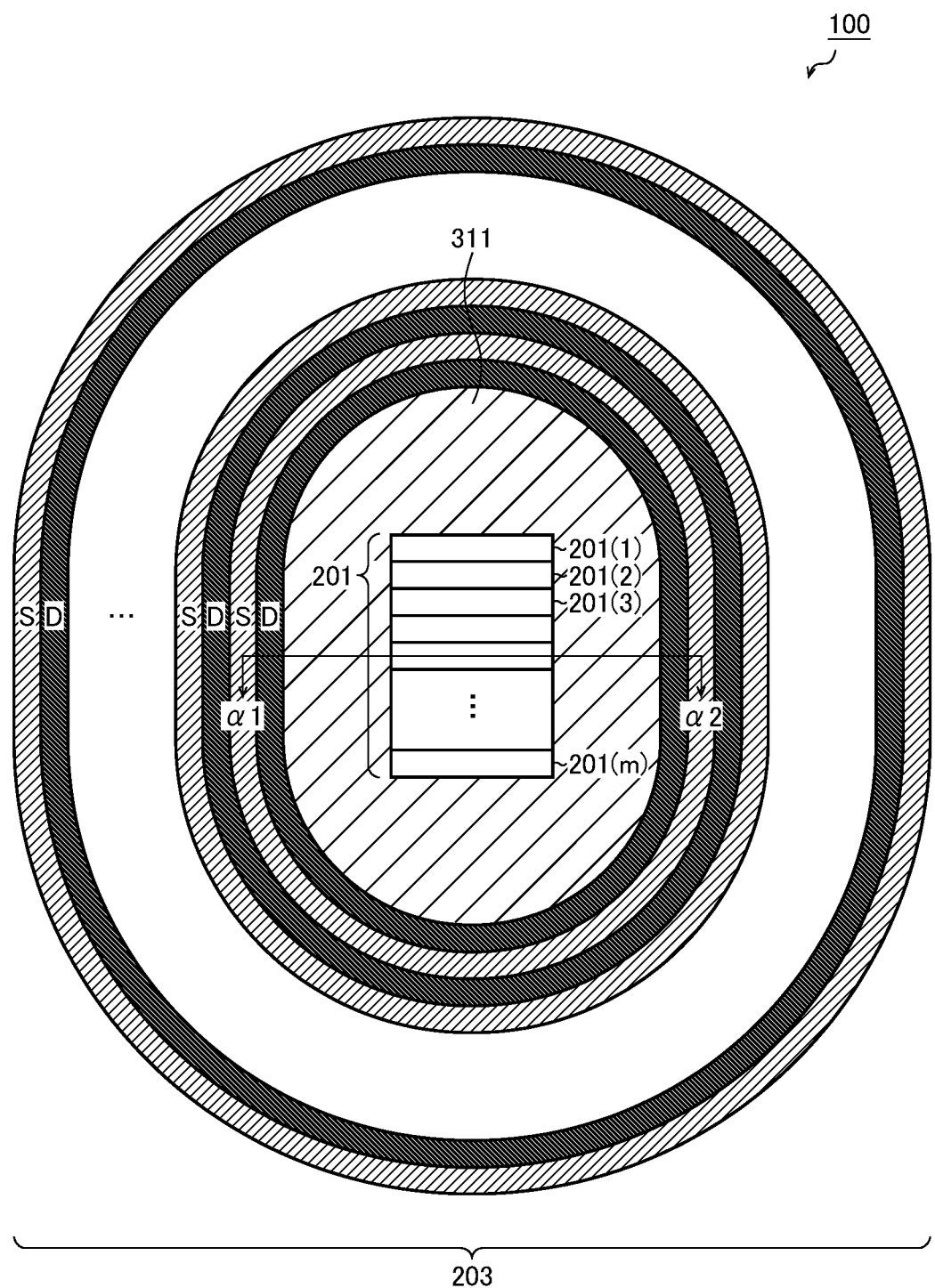
FIG. 7 is a top view showing one structure example of a high-withstand-voltage region.

FIGS. 6 and 7 are a vertical sectional view and a top view, respectively, showing one structure example of the power IC 100 (in particular, around a central part of the high-withstand-voltage region 203). The vertical sectional view in FIG. 6 schematically shows section α1-α2 in FIG. 7.

The illustrated power IC 100 has a p-type semiconductor substrate 301 (corresponding to the semiconductor substrate 200 mentioned previously), in which the high-withstand-voltage region 203 (i.e., LDMOSFET region) is formed. More specifically, in the p-type semiconductor substrate 301, in a central part of the high-withstand-voltage region 203, there are formed a low-doped n-type semiconductor region 302 and a high-doped p-type semiconductor region 303 such that the latter surrounds the former. The withstand voltage in the substrate thickness direction in the high-withstand-voltage region 203 is the higher the lower the dopant density in, or the larger the thickness of, the low-doped n-type semiconductor region 302.

In the low-doped n-type semiconductor region 302, a high-doped n-type semiconductor region 304 is formed; in the high-doped p-type semiconductor region 303, a high-doped n-type semiconductor region 305 is formed. These high-doped n-type semiconductor regions 304 and 305 correspond to the drain region (D) and the source region (S), respectively, of the LDMOSFET. As shown in FIG. 7, in the high-withstand-voltage region 203, a plurality of drain regions (D) and source regions (S) that are concentric and annular as seen in a plan view are formed alternately.

In a top layer around the outer edge of the low-doped n-type semiconductor region 302, a field oxide film 306 is formed so as to surround the high-doped n-type semiconductor region 304. In a top layer of the p-type semiconductor substrate 301, a gate oxide film 307 is formed so as to bridge between the high-doped n-type semiconductor region 305 and the field oxide film 306. On the gate oxide film 307, a gate region (G) made of polysilicon is formed.

On the field oxide film 306, a field plate 309 made of polysilicon is formed as a means for obtaining an even electrical field distribution (even intervals between equipotential lines) and thereby preventing withstand voltage breakdown.

Directly under the field oxide film 306, a low-doped p-type semiconductor region 310 is formed as a means for producing a parasitic capacitance between the field oxide film 306 and the low-doped n-type semiconductor region 302. This structure helps increase the withstand voltage in the substrate thickness direction as much as the hold voltage of the parasitic capacitance.

In a top layer of a central part of the low-doped n-type semiconductor region 302 surrounded by the high-doped n-type semiconductor region 305 (corresponding to the innermost drain region (D)), a field oxide film 311 is formed, and on this field oxide film 311, the feedback resistor 201 mentioned previously is formed. The feedback resistor 201 can be formed by use of the same polysilicon layer as the gate region 308 and the field plate 309. In the illustrated example, the feedback resistor 201 is, in opposite end parts of it, connected to a first metal layer 1M by way of vias, and the first metal layer 1M is connected to a second metal layer 2M by way of vias. This, however, is not meant to limit the number of metal layers that are stacked together: there may be provided only one layer or three or more layers.

As shown in FIG. 7, the feedback resistor 201 can be formed by combining together a plurality of unit resistors 201(1) to 201(m) (where m≥2). For example, in a case where each unit resistor has a resistance value of 1 MΩ and the composite resistance (=Ra+Rb) is required to be 10 MΩ, ten unit resistors can be connected in series. Using a configuration that allows freely changing the interconnection (series or parallel) among the unit resistors 201(1) to 201(m) and the output terminal for the feedback voltage Vfb makes it possible to adjust the voltage division ratio for the direct-current output voltage Vo. This facilitates variable control of the target value of the direct-current output voltage Vo.

As described above, using an LDMOSFET region (with a withstand voltage of, for example, 600 V) as the high-withstand-voltage region 203 helps achieve high voltage tolerance between the feedback resistor 201 and the p-type semiconductor substrate 301.

<Pin Arrangement>

FIGS. 8 to 11 are plan views showing a first to a fourth example, respectively, of pin arrangement in the power IC 100. FIGS. 8 to 11 each show a power IC 100 where, from each of the longer sides of the package, n external terminals are led out such that a total of 2×n external terminals extend in opposite directions. Examples of such packages include SOPs (small outline packages) and DIPs (dual in-line packages). While FIGS. 8 and 9 each show an 8-pin package (n=4), FIGS. 10 and 11 each show a 16-pin package (n=8).

In each of FIGS. 8 to 11, the external terminal TA indicated as a hatched area is a high-withstand-voltage terminal for receiving the direct-current output voltage Vo (e.g., 400 V) (corresponding to the external terminal T1 in FIG. 1 or 2 or the external terminal T15 in FIG. 3 or 4). On the other hand, the external terminals TB indicated by hollow areas (including those not identified by a reference sign) are low-withstand-voltage terminals which do not receive a voltage so high as the direct-current output voltage Vo. In the following description of pin arrangement, it is assumed that the terminal-to-terminal distance between the external terminal TA and an external terminal TB adjacent to it equals d1, and that the terminal-to-terminal distance between mutually adjacent external terminals TB (corresponding to the pin interval defined for the package) equals d2.

Figure 8:
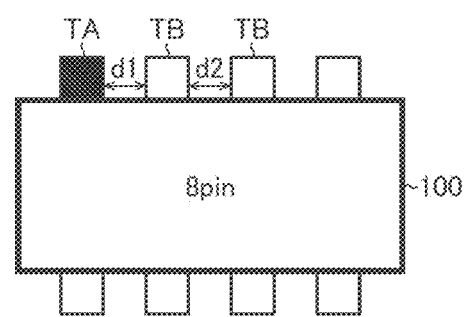
FIG. 8 is a plan view showing a first example of pin arrangement.

To ensure insulation between the external terminal TA, to which a high voltage is applied, and an external terminal TB adjacent to it, the two terminals need to be arranged with a sufficient creepage distance dx secured between them. Here, if d2>dx, adopting a design such that d1=d2 (>dx) as shown in FIG. 8 is practicable; thus the external terminals TA and TB can be dealt with equally.

However, if dx>d2, a design such that d1>dx>d2 can be achieved by omitting the external terminal that would otherwise be disposed between the external terminals TA and TB or leaving that external terminal unused.

Figure 9:
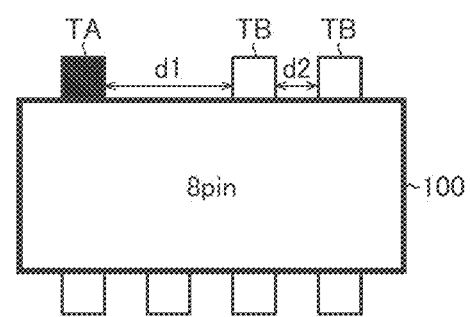
FIG. 9 is a plan view showing a second example of pin arrangement.
Figure 10:
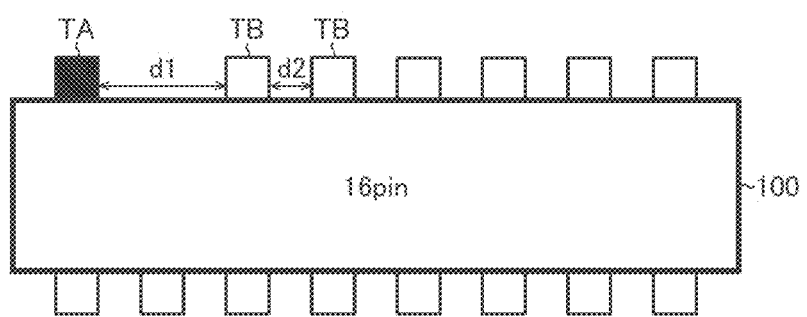
FIG. 10 is a plan view showing a third example of pin arrangement.
Figure 11:
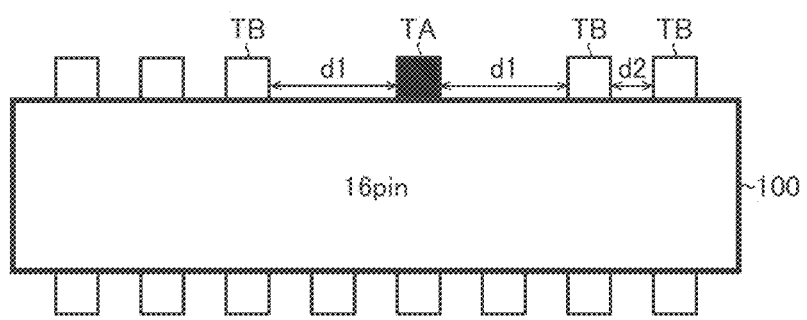
FIG. 11 is a plan view showing a fourth example of pin arrangement.

From the perspective of reducing the number of low-withstand-voltage terminals disposed adjacent to a high-withstand-voltage terminal, it is preferable that the external terminal TA be disposed in an end part along a longer side of the package. In particular, in a package with eight or less pins, it is necessary that the external terminal TA be disposed in an end part along a longer side of the package as shown in FIGS. 8 and 9. In contrast, in a package with more pins (e.g., a 16-pin package), the external terminal TA can be disposed, if desired, elsewhere than in an end part along a longer side of the package.

<Overview>

To follow is an overview of various embodiments discloses herein.

According to one aspect of what is disclosed herein, a power IC for use as a principal controller in a switching power supply includes: a feedback resistor configured to generate a feedback voltage by dividing the output voltage of the switching power supply or a voltage commensurate with the output voltage of the switching power supply; and an output feedback controller configured to perform output feedback control on the switching power supply in accordance with the feedback voltage. The feedback resistor and the output feedback controller are integrated on a single semiconductor substrate. The feedback resistor is a polysilicon resistor with a withstand voltage of 100 V or higher. (A first configuration.)

In the power IC of the first configuration described above, preferably, in the semiconductor substrate, a high-withstand-voltage region is formed where the withstand voltage in the substrate thickness direction is higher than elsewhere in the semiconductor substrate, and the feedback resistor is formed on the high-withstand-voltage region. (A second configuration.)

In the power IC of the second configuration described above, preferably, the high-withstand-voltage region is an LDMOSFET region. (A third configuration.)

In the power IC of the third configuration described above, preferably, in the LDMOSFET region, a plurality of drain regions and source regions that are concentric and annular as seen in a plan view are formed alternately, and the feedback resistor is formed on a field oxide film surrounded by the innermost drain region. (A fourth configuration.)

In the power IC of the fourth configuration described above, preferably, the feedback resistor is composed of a plurality of unit resistors combined together. (A fifth configuration.)

In the power IC of any of the first to fifth configurations described above, preferably, the terminal-to-terminal distance between a first external terminal for receiving the output voltage and a second external terminal other than the first external terminal is equal to or larger than the terminal-to-terminal distance between second external terminals. (A sixth configuration.)

In the power IC of any of the first to sixth configurations described above, preferably, a first external terminal for receiving the output voltage is disposed in an end part of a package. (A seventh configuration.)

According to another aspect of what is disclosed herein, a switching power supply includes: the power IC of any of the first to seventh configurations described above; and a switching output stage configured to be controlled by the power IC. (An eighth configuration.)

In the switching power supply of the eighth configuration described above, preferably, the switching output stage is configured to function as a circuit element of a DC-DC converter configured to generate a direct-current output voltage from a direct-current input voltage. (A ninth configuration.)

In the switching power supply of the ninth configuration described above, preferably, there is further provided a rectifier configured to generate the direct-current input voltage from an alternating-current input voltage. (A tenth configuration.)

In the switching power supply of the tenth configuration described above, preferably, the power IC has a power factor correction function of keeping equal the phase of the alternating-current input voltage and the phase of an alternating-current input current. (An eleventh configuration.)

According to yet another aspect of what is disclosed herein, an electronic appliance includes: the switching power supply of any of the eighth to eleventh configurations described above; and a load configured to operate by being supplied with electric power from the switching power supply. (A twelfth configuration.)

According to still another aspect of what is disclosed herein, a power IC for use as a principal controller in an isolated switching power supply includes: a feedback resistor configured to generate a feedback voltage by dividing an induced voltage appearing in an auxiliary winding provided on the primary side of a transformer included in the isolated switching power supply; and an output feedback controller configured to perform output feedback control on the isolated switching power supply in accordance with the feedback voltage. The feedback resistor and the output feedback controller are integrated on a single semiconductor substrate. The feedback resistor is a polysilicon resistor with a withstand voltage of 100 V or higher. (A thirteenth configuration.)

In the power IC of the thirteenth configuration described above, preferably, in the semiconductor substrate, a high-withstand-voltage region is formed where the withstand voltage in the substrate thickness direction is higher than elsewhere in the semiconductor substrate, and the feedback resistor is formed on the high-withstand-voltage region. (A fourteenth configuration.)

In the power IC of the fourteenth configuration described above, preferably, the high-withstand-voltage region is an LDMOSFET region. (A fifteenth configuration.)

In the power IC of the fifteenth configuration described above, preferably, in the LDMOSFET region, a plurality of drain regions and source regions that are concentric and annular as seen in a plan view are formed alternately, and the feedback resistor is formed on a field oxide film surrounded by the innermost drain region. (A sixteenth configuration.)

In the power IC of the sixteenth configuration described above, preferably, the feedback resistor is composed of a plurality of unit resistors combined together. (A seventeenth configuration.)

In the power IC of any of the thirteenth to seventeenth configurations described above, preferably, the terminal-to-terminal distance between a first external terminal for receiving the output voltage and a second external terminal other than the first external terminal is equal to or larger than the terminal-to-terminal distance between second external terminals. (An eighteenth configuration.)

In the power IC of any of the thirteenth to eighteenth configurations described above, preferably, a first external terminal for receiving the output voltage is disposed in an end part of a package. (A nineteenth configuration.)

According to still another aspect of what is disclosed herein, a isolated switching power supply includes: the power IC of any of the thirteenth to nineteenth configurations described above; and a switching output stage configured to be controlled by the power IC. (A twentieth configuration.)

In the isolated switching power supply of the twentieth configuration described above, preferably, the switching output stage is configured to function as a circuit element of a DC-DC converter configured to, while isolating a primary circuit system and a secondary circuit system from each other by using a transformer, generate from a direct-current input voltage supplied to the primary circuit system a direct-current output voltage and supply the direct-current output voltage to a load in the secondary circuit system. (A twenty-first configuration.)

In the isolated switching power supply of the twenty-first configuration described above, preferably, there is further provided a rectifier configured to generate the direct-current input voltage from an alternating-current input voltage. (A twenty-second configuration.)

According to still another aspect of what is disclosed herein, an electronic appliance includes: the isolated switching power supply of any of the twentieth to twenty-second configurations described above; and a load configured to operate by being supplied with electric power from the isolated switching power supply. (A twenty-third configuration.)

The various technical features disclosed herein can be implemented in any manner other than specifically described by way of embodiments above, and allow for many modifications within the spirit of the technical ingenuity involved. That is, it should be understood that the embodiments disclosed herein are in every aspect illustrative and not restrictive, and that the technical scope of the present invention is defined not by the description of embodiments given above but by the scope of the appended claims and encompasses any modifications within a spirit and scope equivalent to those of the claims.

INDUSTRIAL APPLICABILITY

The invention disclosed herein finds applications in non-isolated and isolated switching power supplies used in any fields (such as household electric appliances, automobiles, industrial machinery, etc.)

REFERENCE SIGNS LIST 1M first metal layer
2M second metal layer
1$p$ primary circuit system (GND1 system)
1$s$ secondary circuit system (GND2 system)
1$x$ switching power supply
1$y$ isolated switching power supply
2 load
10$x$, 10$y$ rectifier
11 filter
12 diode bridge
13, 14 capacitor
20$x$, 20$y$ DC-DC converter
100 (100$x$, 100$y$) power IC
101 resistor voltage divider
102 error amplifier
103 oscillator 104 comparator
105 filter
106 comparator
107 signal retarder
108 timer
109 AND operator
110 RS flip-flop
111, 112 comparator
113, 114 inverter
115 AND operator
116 pre-driver
117 P-channel MOS field-effect transistor
118 N-channel MOS field-effect transistor
119 clamper
121 resistor voltage divider
122 sample-and-hold circuit
123 error amplifier
124, 125 comparator
126 controller
127 oscillator
128 RS flip-flop
129 output switch
130 mask processor
200 semiconductor substrate
201 feedback resistor (polysilicon resistor)
201(1) to 201(m) unit resistor
202 output feedback controller
203 high-withstand-voltage region (LDMOSFET region)
204, 205 metal conductor
301 p-type semiconductor substrate
302 low-doped n-type semiconductor region
303 high-doped p-type semiconductor region
304, 305 high-doped n-type semiconductor region
306 field oxide film
307 gate oxide film
308 gate region
309 field plate
310 low-doped p-type semiconductor region
311 field oxide film
C1 to C3, C11 to C14 capacitor
D1, D11, D12 diode
L1 coil
L11 primary winding
L12 secondary winding
L13 auxiliary winding
LED light-emitting diode
N1 N-channel MOS field-effect transistor
PT phototransistor
PW commercial power source
R1 to R7, R11 to R18 resistors
Ra, Rb feedback resistor
REG shunt regulator
T1 to T8, T11 to T17 external terminal
TA first external terminal (high-withstand-voltage terminal)
TB second external terminal (low-withstand-voltage terminal)
TR transformer
X, Y electronic appliance

The invention claimed is:

1. A power IC for use as a principal controller in a switching power supply, the power IC comprising:
   a feedback resistor configured to generate a feedback voltage by dividing an output voltage of the switching power supply or a voltage commensurate with the output voltage of the switching power supply; and
   an output feedback controller configured to perform output feedback control on the switching power supply in accordance with the feedback voltage,
   wherein:
      the feedback resistor and the output feedback controller are integrated on a single semiconductor substrate, and
   the feedback resistor is a polysilicon resistor with a withstand voltage of 100 V or higher,
   wherein:
      in the semiconductor substrate, a high-withstand-voltage region is formed where a withstand voltage in a substrate thickness direction is higher than elsewhere in the semiconductor substrate, and
   the feedback resistor is formed on the high-withstand-voltage region,
   wherein:
      the high-withstand-voltage region is an LDMOSFET region,
      in the LDMOSFET region, a plurality of drain regions and source regions that are concentric and annular as seen in a plan view are formed alternately, and
      the feedback resistor is formed on a field oxide film surrounded by an innermost drain region.

2. The power IC according to claim 1, wherein the feedback resistor is composed of a plurality of unit resistors combined together.

3. A switching power supply comprising:
   the power IC according to claim 1; and
   a switching output stage configured to be controlled by the power IC.

4. The switching power supply according to claim 3, wherein
   the switching output stage is configured to function as a circuit element of a DC-DC converter configured to generate a direct-current output voltage from a direct-current input voltage.

5. The switching power supply according to claim 4, wherein
   the DC-DC converter is configured to, while isolating a primary circuit system and a secondary circuit system from each other by using a transformer, generate from the direct-current input voltage, which is supplied to the primary circuit system, the direct-current output voltage and supply the direct-current output voltage to a load in the secondary circuit system.

6. The switching power supply according to claim 4, further comprising:
   a rectifier configured to generate the direct-current input voltage from an alternating-current input voltage.

7. The switching power supply according to claim 6, wherein
   the power IC has a power factor correction function of keeping equal a phase of the alternating-current input voltage and a phase of an alternating-current input current.

8. An electronic appliance comprising:
   the switching power supply according to claim 3; and
   a load configured to operate by being supplied with electric power from the switching power supply.

9. The power IC according to claim 1, wherein the feedback resistor is configured to generate the feedback voltage by dividing an induced voltage appearing in an auxiliary winding provided on a primary side of a transformer included in the switching power supply, which is of an isolated type.

* * * * *